(12) United States Patent
Bertram

(10) Patent No.: US 8,581,292 B2
(45) Date of Patent: Nov. 12, 2013

(54) LIGHT EMITTING DIODE DEVICE

(75) Inventor: Dietrich Bertram, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 391 days.

(21) Appl. No.: 12/933,170

(22) PCT Filed: Mar. 23, 2009

(86) PCT No.: PCT/IB2009/051205
§ 371 (c)(1),
(2), (4) Date: Sep. 17, 2010

(87) PCT Pub. No.: WO2009/118678
PCT Pub. Date: Oct. 1, 2009

(65) Prior Publication Data
US 2011/0018025 A1   Jan. 27, 2011

(30) Foreign Application Priority Data
Mar. 26, 2008 (EP) ..................................... 08102921

(51) Int. Cl.
*H01L 33/00* (2010.01)
(52) U.S. Cl.
USPC ........................ 257/99; 257/98; 257/E51.018
(58) Field of Classification Search
USPC .................. 257/40, 98–100, 81–82, E51.018
See application file for complete search history.

(56) References Cited

U.S. PATENT DOCUMENTS

| | | | |
|---|---|---|---|
| 6,465,953 B1 | 10/2002 | Duggal | |
| 6,771,021 B2 | 8/2004 | Cok | |
| 7,060,591 B2 | 6/2006 | Yamazaki et al. | |
| 7,075,226 B2 | 7/2006 | Cok | |
| 7,166,006 B2 | 1/2007 | Cok | |
| 7,256,427 B2 | 8/2007 | Daniels | |
| 2004/0160178 A1 | 8/2004 | Qiu et al. | |
| 2004/0238856 A1 | 12/2004 | Mkel et al. | |
| 2005/0164470 A1* | 7/2005 | Yamazaki et al. | 438/455 |
| 2006/0098153 A1 | 5/2006 | Slikkerveer et al. | |
| 2006/0273304 A1 | 12/2006 | Cok | |
| 2007/0009222 A1 | 1/2007 | Koo et al. | |

FOREIGN PATENT DOCUMENTS

| | | |
|---|---|---|
| EP | 1367676 A1 | 12/2003 |
| EP | 1367677 A2 | 12/2003 |
| WO | 2004086530 A1 | 10/2004 |

* cited by examiner

*Primary Examiner* — Chuong A Luu
*Assistant Examiner* — Nga Doan
(74) *Attorney, Agent, or Firm* — David Zivan; Mark L. Beloborodov

(57) ABSTRACT

The invention relates to a light emitting diode device comprising a light emitting diode arrangement comprising a flexible substrate (103) having an inner surface and an outer surface, and a light emitting diode (101) arranged on the inner surface of the flexible substrate (103) and a shape element (105, 107) at least partly covering the outer surface of the flexible substrate (103) and a surface of the light emitting diode (101) so as to at least partly sandwich the light emitting diode arrangement, the shape element (105, 107) being formed to determine a shape of the light emitting diode arrangement.

10 Claims, 2 Drawing Sheets

LIGHT EMITTING DIODE DEVICE

FIELD OF THE INVENTION

The invention relates to light emitting diodes, in particular to organic light emitting diodes.

BACKGROUND OF THE INVENTION

Light emitting diodes, in particular organic light emitting diodes (OLEDs), are typically manufactured on glass substrates in order to obtain protection against water and oxygen influences and thus to guarantee a long life time. However, bending an OLED arranged on a glass substrate is not possible since the necessary high temperatures which are required to melt glass would destroy the organic layers of the OLED. The US 2006/0273304 describes a light emitting diode with a curved surface with an encapsulation cover.

SUMMARY OF THE INVENTION

It is the object of the invention to provide an efficient concept for shaping light emitting diode devices.

This object is achieved by the features of the independent claims.

The invention is based on the finding that a light emitting diode may be formed e.g. on a flexible foil substrate that can be shaped three-dimensionally. Thus, the light emitting diode and the flexible substrate form a light emitting diode arrangement which may be encapsulated between e.g. two glass sheets forming a seal and determining the shape of the resulting light emitting diode device. The seal may be fabricated according to known encapsulation approaches where e.g. two glass plates are glued together in order to avoid negatively affecting the light emitting diode by moisture.

The inventive encapsulation approach is durable, mechanically stable and may also be used in the field of automotive technologies, decorative approaches or architecture.

The invention relates to a light emitting diode device comprising a light emitting diode arrangement comprising a flexible substrate having an inner surface and an outer surface, a light emitting diode arranged on the inner surface of the flexible substrate, and a shape element at least partly covering the outer surface of the flexible substrate and a surface of the light emitting diode so as to at least partly sandwich the light emitting diode arrangement, the shape element being formed to determine a shape of the light emitting diode arrangement. The term "sandwich" relates not only to sandwiching the light emitting diode arrangement where the shape element may contact or not contact to the light emitting diode arrangement but also to at least partly surrounding or covering the light emitting diode arrangement by the shape element which may at least partly contact or may not contact to the light emitting diode arrangement. Furthermore, the shape element may at least partly encapsulate the light emitting diode arrangement.

According to an embodiment, the flexible substrate may be a foil, in particular a translucent foil or a metallic foil or a translucent metallic foil.

According to an embodiment, the flexible substrate forms an electrode of the light emitting diode.

According to an embodiment, the light emitting diode comprises an electrode and a light emitting layer, the electrode or the light emitting layer being arranged on the inner surface of the flexible substrate.

According to an embodiment, the light emitting diode is an organic light emitting diode.

According to an embodiment, the shape element is formed to determine a curvature of the light emitting diode arrangement.

According to an embodiment, the shape element is formed of a translucent non-flexible or flexible material, in particular of glass or of a plastic or of a plastic laminate or of a flexible foil or of an aluminum foil.

According to an embodiment, the shape element comprises a first carrier element arranged on the outer surface of the flexible substrate, and a second carrier element arranged on an outer surface of the light emitting diode, the outer surface of the light emitting diode opposing a surface of the light emitting diode facing towards the inner surface of the flexible substrate.

According to an embodiment, the flexible substrate is arranged along a curvature of a first carrier element of the shape element, the light emitting diode is arranged along a curvature of a second carrier element of the shape element.

According to an embodiment, the light emitting diode arrangement is sealed with respect to the shape element.

The invention further relates to a flash light device comprising the light emitting diode device according to the invention.

The invention further relates to a method for manufacturing a light emitting diode device according to the invention. The method comprises arranging a light emitting diode, in particular an organic light emitting diode, on a flexible substrate to obtain a light emitting diode arrangement and at least partly covering an outer surface of the flexible substrate and a surface of the light emitting diode so as to at least partly sandwich the light emitting diode arrangement for determining a shape of the light emitting diode arrangement.

The invention further relates to a combination of a foil based area light source, e.g. an OLED, with three-dimensionally shaped cover glass for shaping, sealing and protecting the light source from environmental influences.

The invention further relates to the use of such a three-dimensionally formed light source, e.g. a flash light, in automotive, architectural and/or decorative applications such as rear lamps of course, interior dome lamps, curved surface lights in e.g. buildings or for decorative objects.

Furthermore, the encapsulation may also comprise a pre-shaped glass and a flexible, e.g. bendable, cover foil made of e.g. aluminum foil to seal and protect the light emitting diode arrangement.

BRIEF DESCRIPTION OF THE DRAWINGS

Further embodiments of the invention will be described with respect to the following figures, in which.

DETAILED DESCRIPTION OF EMBODIMENTS

Figure 1:
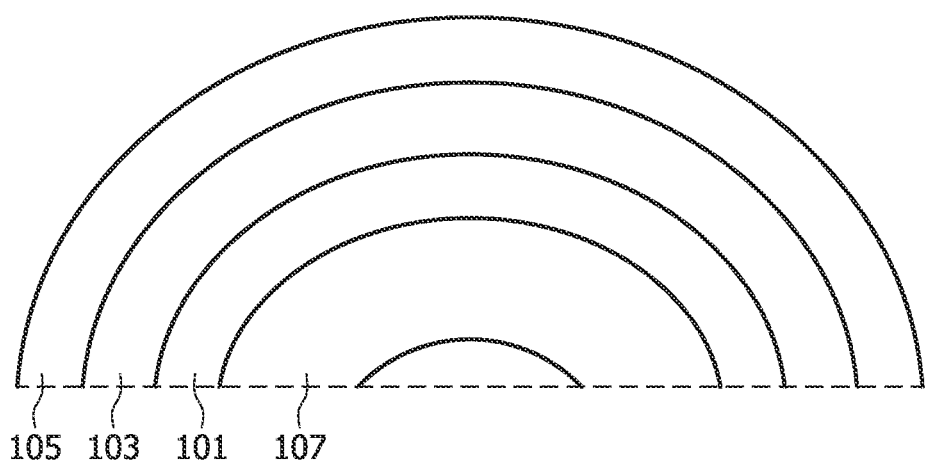
FIG. 1 shows a light emitting diode device.

FIG. 1 shows a light emitting diode device having a light emitting diode 101, e.g. an organic light emitting diode, arranged on an inner surface of a flexible substrate 103 being formed by e.g. a flexible foil. The light emitting diode 101 and the flexible substrate 103 form a light emitting diode arrangement being encapsulated by a shape element comprising a first carrier element 105 and a second carrier element 107. The shape element encapsulates the light emitting diode arrangement and thus determines its shape as depicted in FIG. 1. The shape of the light emitting diode device may be convex or concave or may have any curvature or any shape since the flexible substrate 103 is preferably bendable in each direction.

The first carrier element 105 is arranged above the flexible element 103 and may contact or not contact the same. Correspondingly, the second carrier element 107 is arranged underneath the light emitting diode 101 and may contact or not contact its surface.

The light emitting diode 101 may comprise a plurality of layers, e.g. a first electrode which may be arranged on a lower surface of the flexible substrate 103, one or more light emitting layers arranged on the first electrode, and a second electrode formed over the one or more light emitting layers. The light emitting layers may be of organic material so as to form the OLED. Furthermore, the first electrode may be formed by the flexible substrate being formed of e.g. a metallic substrate.

Figure 2:
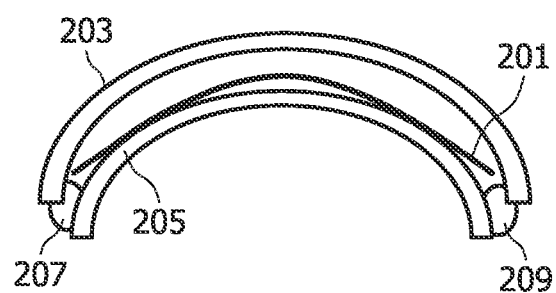
FIG. 2 demonstrates a method for manufacturing a light emitting diode device.

FIG. 2 shows a light emitting device comprising a light emitting diode arrangement 201 which is encapsulated by a shape element comprising a first carrier element 203 and a second carrier element 205. The light emitting diode arrangement 201 comprises a flexible substrate and a light emitting diode, e.g. an OLED, arranged on a surface of the flexible substrate. Generally, the light emitting diode arrangement 201 may have the characteristics of the light emitting diode arrangement of FIG. 1.

The first and second carrier elements 203 and 205 are arranged so as to encapsulate the light emitting diode arrangement 201 which is, by way of example, arranged along a curvature of the second carrier element 205. Furthermore, sealing elements 207 and 209 are provided so as to seal the light emitting diode arrangement 201 within the shape elements.

The light emitting diode arrangement 201 emits light e.g. towards the first carrier element 203 or towards the second carrier element 205. Thus, the first carrier element 203 and/or the second carrier element 205 may be translucent elements made of e.g. glass.

Figure 3:
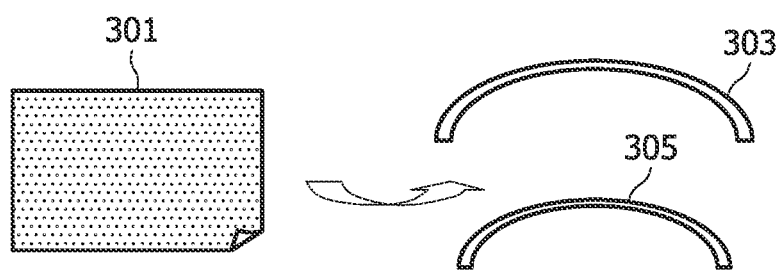
FIG. 3 shows a light emitting diode device.

FIG. 3 demonstrates the steps of manufacturing a light emitting diode device. In particular, a light emitting diode arrangement 301 comprising e.g. a light emitting diode arranged on a flexible substrate as described above is arranged between a first carrier element 303 and a second carrier element 305 forming a shape element determining the shape of the resulting light emitting diode device. Thus, the first carrier element 303 forms an upper carrier and the second carrier element 305 forms a lower carrier.

In order to manufacture the light emitting diode device, e.g. the electronics on plastic by laser release (EPLAR) methods or similar methods may be employed for e.g. providing a direct evaporation on a foil. The resulting package may further contain a getter for absorbing moisture penetrating the package through e.g. the glue seals 207 and 209.

The light emitting diode device forming e.g. an OLED device can be of any type, including a reflective cathode or a transparent cathode. The inventive approach may also be applied in several products, for example in cars for curved surface lightening or for a combination of lights like a stop light, a turn light or tile lights or the like. In other application areas include curved surface lamps for e.g. architectural purposes in indoor and outdoor use.

The inventive light emitting diode device may be used in signalling and advertising lights, used as rails on stairs e.g. in buildings, in marking lights, e.g. in urban furniture, in traffic guiding lights e.g. in construction areas, in indicator lights, e.g. for automotive rear indication, in automotive brake lights, in automotive stop lights, in automotive signalling lights or combinations of these functions, in decorative lighting elements, e.g. in furniture, in particular in kitchen furniture, in bathroom installations or in decorative objects, in status indicator lights, e.g. in household appliances, in entertainment systems or in electronic gears.

The invention claimed is:

1. Light emitting diode device, comprising:
a light emitting diode arrangement comprising a flexible substrate having an inner surface and an outer surface opposing said inner surface, and a light emitting diode arranged on the inner surface of the flexible substrate; and
a shape element at least partly covering the outer surface of the flexible substrate and a surface of the light emitting diode so as to at least partly enclose the light emitting diode arrangement, the shape element being an encapsulant and contacting said flexible substrate along the outer surface, wherein said contacting is a primary means of shaping said flexible substrate and said light emitting diode into a non-planar shape.

2. The light emitting diode device according to claim 1, wherein the flexible substrate comprises a foil.

3. The light emitting diode device according to claim 1, the flexible substrate forms an electrode of the light emitting diode.

4. The light emitting diode device according to claim 1, the light emitting diode comprising an electrode and a light emitting layer, the electrode or the light emitting layer being arranged on the inner surface of the flexible substrate.

5. The light emitting diode device according to claim 1, the light emitting diode being an organic light emitting diode.

6. The light emitting diode device according to claim 1 the shape element being formed to determine a curvature of the light emitting diode arrangement.

7. The light emitting diode device according to claim 1, the shape element being formed of a translucent non-flexible or flexible material.

8. The light emitting diode device according to claim 1, the shape element comprising a first carrier element facing the outer surface of the flexible substrate and a second carrier element facing an outer surface of the light emitting diode, the outer surface of the light emitting diode opposing a surface of the light emitting diode facing towards the inner surface of the flexible substrate.

9. The light emitting diode device according to claim 1, the flexible substrate being arranged along a curvature of a first carrier element of the shape element the light emitting diode being arranged along a curvature of a second carrier element of the shape element.

10. The light emitting diode device according to claim 1, the light emitting diode arrangement being sealed with respect to the shape element.

* * * * *